United States Patent
Yang et al.

(10) Patent No.: US 7,319,258 B2
(45) Date of Patent: Jan. 15, 2008

(54) SEMICONDUCTOR-ON-INSULATOR CHIP WITH <100>-ORIENTED TRANSISTORS

(75) Inventors: Fu-Liang Yang, Hsin-Chu (TW); Yee-Chia Yeo, Kaoshiung (TW); Hung-Wei Chen, Hsinchu (TW); Tim Tsao, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 243 days.

(21) Appl. No.: 10/901,763

(22) Filed: Jul. 28, 2004

(65) Prior Publication Data

US 2005/0093105 A1   May 5, 2005

Related U.S. Application Data

(60) Provisional application No. 60/516,473, filed on Oct. 31, 2003.

(51) Int. Cl.
*H01L 21/01* (2006.01)
*H01L 21/12* (2006.01)

(52) U.S. Cl. .............. 257/347; 257/33; 257/351; 257/E33.003; 257/E29.003

(58) Field of Classification Search ............. 257/347, 257/20, 24, 27, 57, 66, 72, E33.003, E29.003, 257/350–351
See application file for complete search history.

(56) References Cited

U.S. PATENT DOCUMENTS

| 4,768,076 A | 8/1988 | Aoki et al. |
| 4,822,752 A * | 4/1989 | Sugahara et al. ............. 117/43 |
| 4,857,986 A | 8/1989 | Kinugawa |
| 4,933,298 A | 6/1990 | Hasegawa |
| 5,384,473 A | 1/1995 | Yoshikawa et al. |
| 6,410,938 B1 * | 6/2002 | Xiang ........................ 257/49 |
| 6,483,171 B1 | 11/2002 | Forbes et al. |
| 6,639,280 B2 | 10/2003 | Sugatani et al. |
| 6,991,972 B2 * | 1/2006 | Lochtefeld et al. ......... 438/149 |
| 2002/0063292 A1 | 5/2002 | Armstrong et al. |
| 2004/0029323 A1 * | 2/2004 | Shimizu et al. ............. 438/142 |
| 2004/0075141 A1 * | 4/2004 | Maeda et al. ............... 257/347 |
| 2005/0059201 A1 * | 3/2005 | Chidambarrao et al. .... 438/216 |

FOREIGN PATENT DOCUMENTS

JP   4-373177   * 12/1992

OTHER PUBLICATIONS

A. Shimizu et al., "Local Mechanical-Stress Control (LMC): A New Technique for CMOS-Performance Enhancement", 2001 International Electron Device Meeting, Washington, D.C., Technical Digest, pp. 433-436.

* cited by examiner

*Primary Examiner*—Thanhha S. Pham
(74) *Attorney, Agent, or Firm*—Haynes Boone, LLP

(57) ABSTRACT

A semiconductor-on-insulator device includes a silicon active layer with a <100> crystal direction placed over an insulator layer. The insulator layer is placed onto a substrate with a <110> crystal direction. Transistors oriented on a <100> direction are formed on the silicon active layer.

35 Claims, 6 Drawing Sheets

SEMICONDUCTOR-ON-INSULATOR CHIP WITH <100>-ORIENTED TRANSISTORS

CROSS REFERENCE

This application is related to, and claims priority of, U.S. Provisional Patent Application Ser. No. 60/516,473, filed on Oct. 31, 2003.

BACKGROUND

The present disclosure relates to semiconductor integrated circuits, and more specifically to a silicon-on-insulator chip comprising <100> oriented transistors.

Application of longitudinal stress—stress applied in the direction of current flow—modifies the mobilities of electrons and holes in NMOS and PMOS transistors, respectively. By using a conventional bulk silicon substrate with a (001) surface orientation and forming transistors with source-to-drain orientation in <110> directions, application of longitudinal stress leads to different reactions for electrons and holes. When a stress is applied in the longitudinal direction, either the electron mobility is increased and the hole mobility is decreased, or the electron mobility is decreased and the hole mobility is increased.

DETAILED DESCRIPTION

Figure 1:
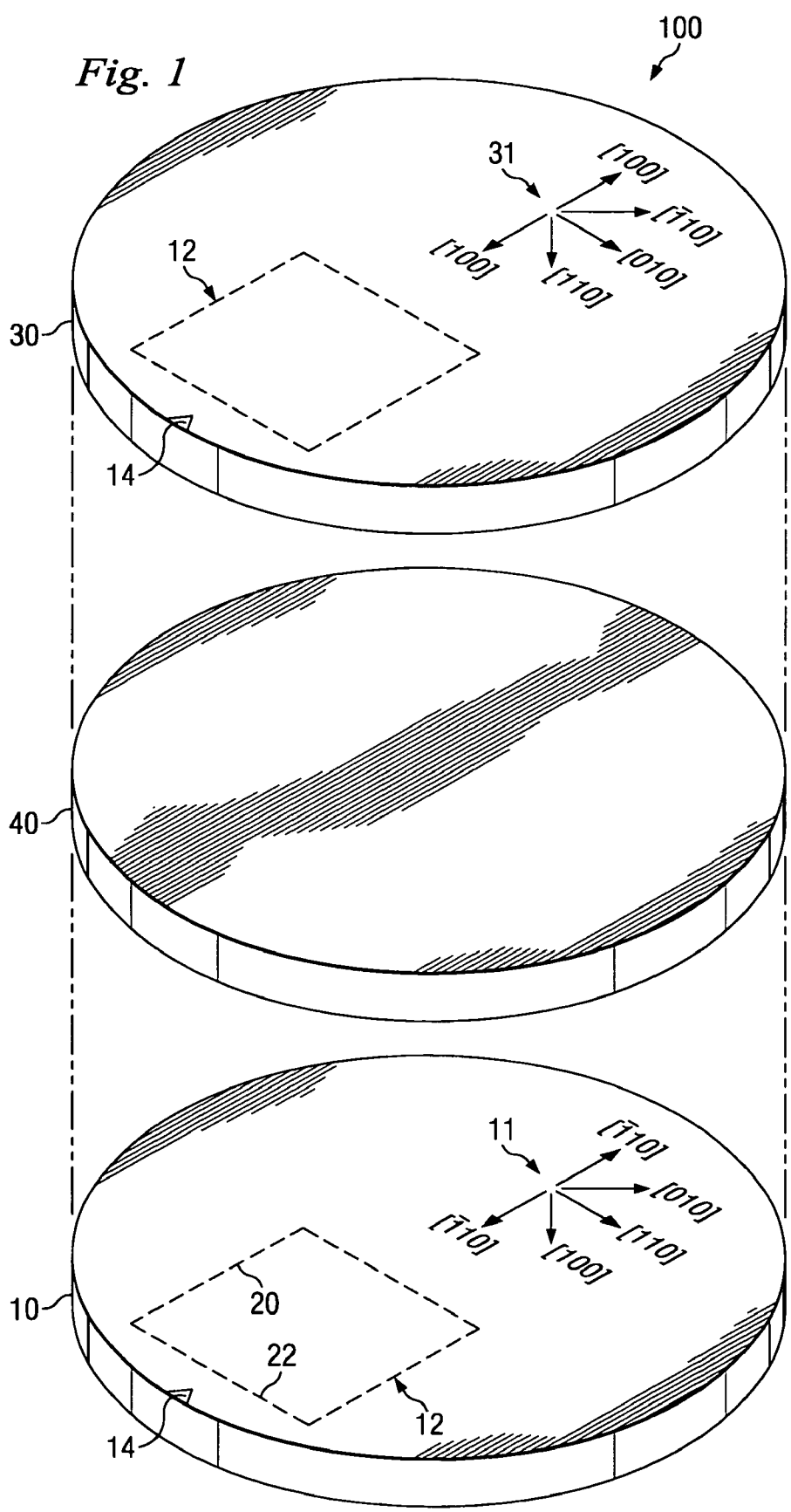
FIG. 1 is an exploded view illustrating a silicon layer formed on an insulator layer overlying a substrate.

It is understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Complementary metal oxide semiconductor (CMOS) fabrication processes conventionally use a bulk silicon substrate with a (001) surface crystal orientation as the starting material to fabricate N-type (NMOS) and P-type (PMOS) devices. In such conventional substrates, the formed transistors have a source-to-drain orientation, i.e. channel orientation, in the <110> directions. The notation <110> indicates all <110> equivalent directions, including the [110] direction and the [110] direction for example. Notations for crystal directions and planes commonly used in crystallography are used here. The [110] and the [110] directions are perpendicular to the (110) and (110) crystal planes, respectively. Incidentally, the (110) and (110) planes are silicon crystal planes that cleave very easily.

Referring to FIG. 1, a silicon-on-insulator substrate 100 is used in one embodiment of the present disclosure. The silicon-on-insulator substrate 100 comprises a silicon layer 30 with a (001) oriented surface plane. The silicon layer 30 is used as an example in this embodiment, and it is understood that other materials such as a silicon-germanium layer, multi-layer, diamond, gallium, and/or arsenic may be used in place of, or in addition to, the silicon layer 30. For example, a multi-layer may be comprised of a silicon germanium layer and a silicon layer.

The silicon layer 30 overlies an insulator layer 40. In general, the insulator layer 40 may comprise any dielectric material, inter-metal dielectric material, or insulating material such as silicon oxide, silicon nitride, carbon, or aluminum oxide (also known as sapphire). The dielectric layer may have various dielectric constants and in one embodiment has a dielectric constant of less than about 4.5. The thickness of the insulator may range from 100 angstroms to 2000 angstroms. The insulator layer may also be a composite layer comprising of a stack combination of dielectric materials, such as a aluminum oxide on a silicon oxide stack, or a silicon nitride on a silicon oxide stack. The insulator layer may be in an amorphous state, poly-crystalline state, or in crystalline state.

The insulator layer 40 overlies a substrate 10, which may be a silicon substrate. However, other types of semiconductor substrates may be used. As illustrated by the Miller Index legends 11, 31, in the present embodiment, the silicon substrate 10 is a conventional silicon substrate having a notch 14 oriented in one of the equivalent <110> directions. However, the silicon layer 30 has a <100> crystal direction pointing in the direction of the notch 14 (downward as shown in FIG. 1). The [110] direction of the substrate 10 is substantially parallel to the [100] direction of the silicon layer 30 (e.g. within plus or minus 10 degrees of parallel).

A first transistor 16, formed on the silicon layer 30, has a source-to-drain direction oriented in the [010] crystal direction, and a second transistor 18, formed on another portion of the silicon layer 30, has a source-to-drain direction oriented in the [100] crystal direction. The first and second transistors therefore have source-to-drain directions oriented in one of the <100> equivalent directions. The first and second transistors 16, 18 can both be NMOS transistors, both PMOS transistors, or be of different types. By orienting transistors 16, 18 to a <100>-equivalent orientation, if stressing is to be used, the relative degradation of one carrier mobility commensurate with a given amount of increase in the mobility of the other type of carrier is reduced.

Figure 2:
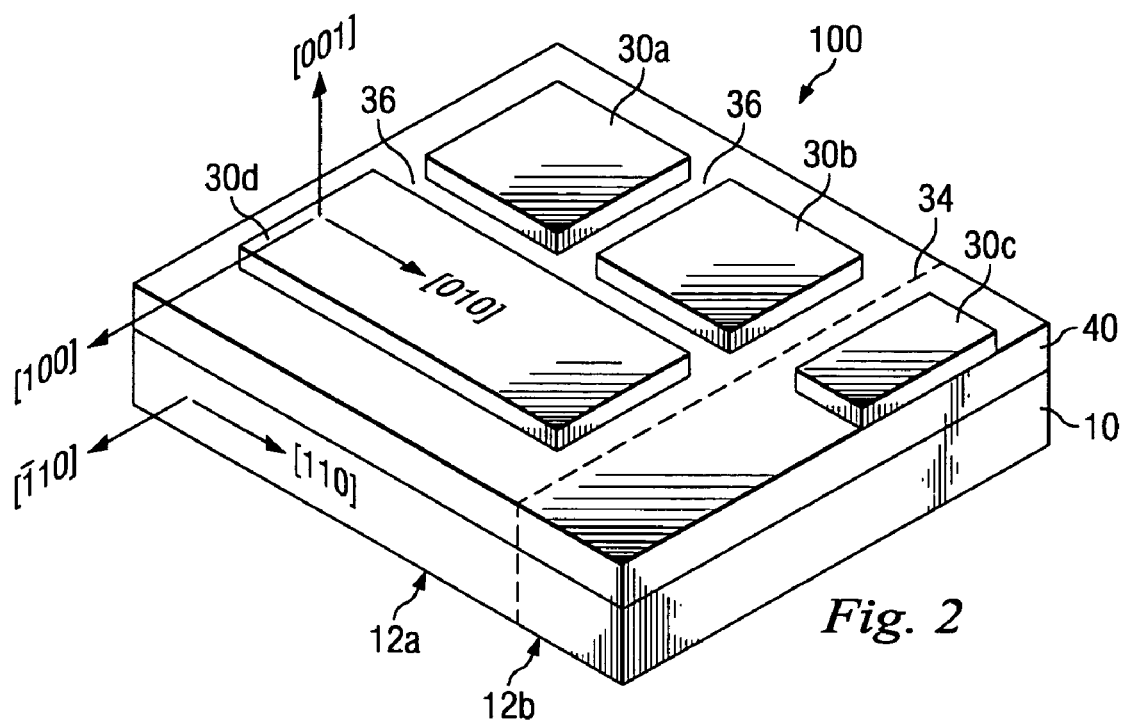
FIG. 2 is a three-dimensional perspective of a silicon-on-insulator chip with directional orientations for the silicon layer and the silicon substrate shown.

Referring now to FIG. 2, the silicon layer 30 (FIG. 1) is semi-processed to form active regions 30a-d where active devices or transistors may be fabricated. The silicon active regions 30a-d have a top (001) oriented crystal surface. The active regions 30a-d may be formed by trenching the silicon layer 30, for example, by plasma etching. A plane 34 depicts where dies 12a, 12b are to be separated or cut. Since the plane 34 that separates the dies 12a, 12b is parallel to a {110} plane or equivalent plane (e.g. a cleavage plane) of the substrate 10, dicing of the substrate is facilitated. Since the plane 34 does not cut through the active regions 30a-d, it is unimportant that it is not parallel to one of their {100}-equivalent planes.

Figure 3:
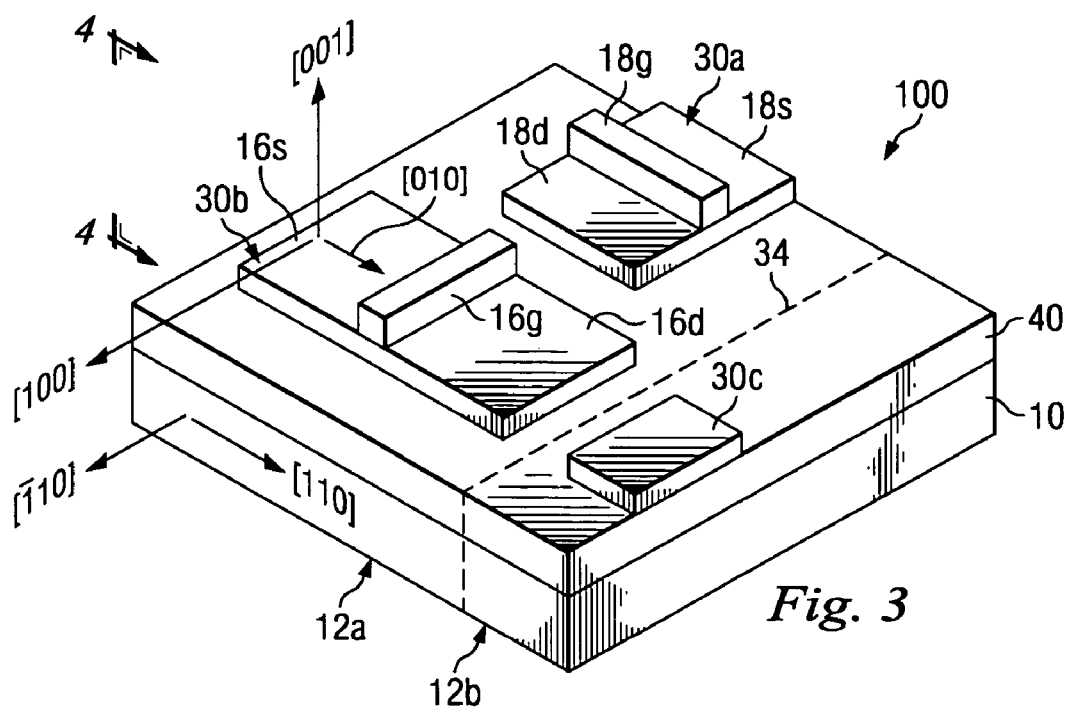
FIG. 3 is a three-dimensional perspective of the silicon-on-insulator chip of FIG. 2 showing a transistor placement according to one embodiment of the present disclosure.

Referring now to FIG. 3, the gate electrodes 16g, 18g, source regions 16s, 18s, and drain regions 16d, 18d of transistors 16, 18 are illustrated. Transistor 16, formed on one of the silicon active regions 30a, is shown with a source-to-drain direction parallel to the [010] direction of the silicon layer 30. Second transistor 18, formed on a silicon active region 30b, is shown with a source-to-drain direction parallel to the [100] direction of the silicon layer 30. The silicon active regions 30a, 30b, may have be strained, mechanically for example. The strain may be a tensile strain or other strain. In some embodiments, only a portion of the transistors 16, 18 may be strained. For example the channel regions may be strained. In FIG. 3, the gate electrodes 16g, 18g are drawn for illustration purposes only, and are shown to lie only on the active regions. However, in actual devices, the gate electrodes may extend beyond the active regions.

There are many different types and configurations of circuit elements that may benefit from the present disclosure. For example, in FIG. 4a, the trench 36 between active regions 30a, 30b is not filled prior to the fabrication of the transistors 16, 18 (e.g. mesa isolation is used). In another example, in FIG. 4b the trench 36 between active regions 30a, 30b is filled with a trench-filling dielectric 60 prior to the fabrication of the transistors 16, 18 (e.g. shallow trench isolation is used). The trench-filling dielectric 60 may be silicon oxide formed by chemical vapor deposition, for further example. The trench-filling dielectric 60 may also be silicon oxide deposited by high-density plasma (HDP) deposition.

Figure 4A:
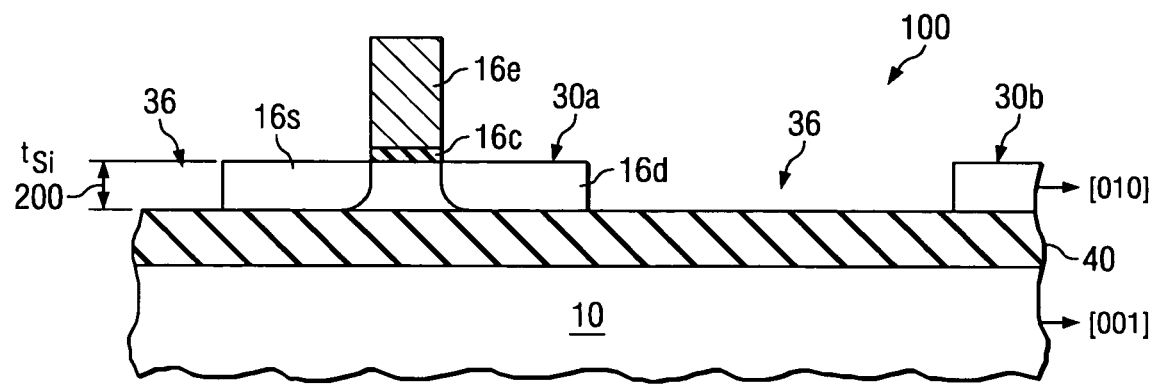
FIG. 4a is a cross section of FIG. 3 showing mesa isolation of the active regions.
Figure 4B:
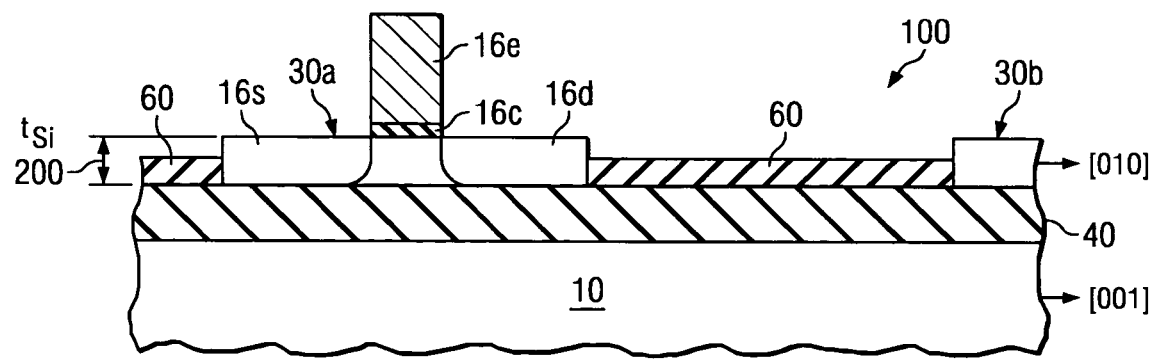
FIG. 4b is a cross section of FIG. 3 showing shallow trench isolation of the active regions.

Referring to both FIGS. 4a and 4b, a thickness $t_{Si}$ 200 of the silicon active regions 30a, 30b may be in the range of 20 angstroms to 2000 angstroms, and in the present embodiment is less than 300 angstroms. In general, the silicon active regions 30a, 30b may not be of the same thickness. It is understood that the cross-sectional views of the silicon active regions (e.g. FIG. 4) are for purposes of illustration only. For example, the silicon active regions 30a, 30b need not have sharp corners. The corners of the silicon active regions 30a, 30b may be faceted or rounded, for example, with a radius of curvature in the range of 10 angstroms to 500 angstroms.

Figure 5A:
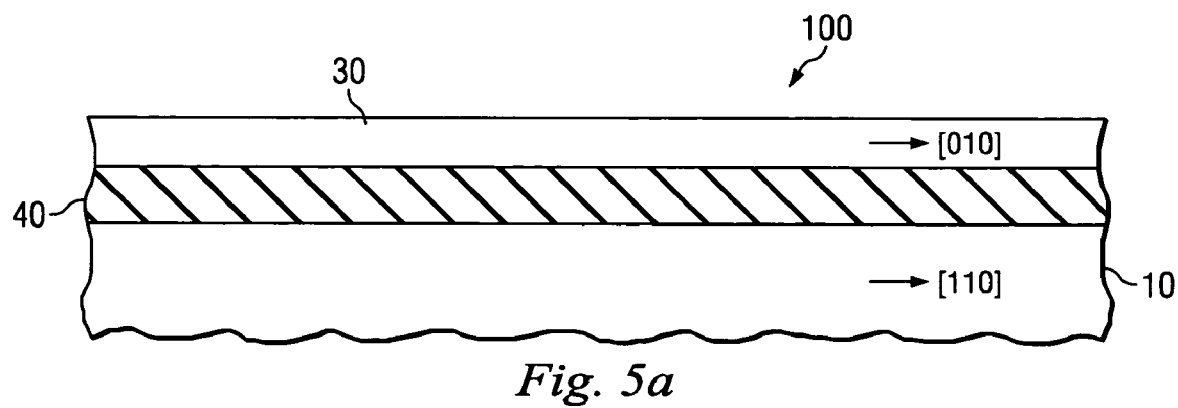
FIGS. 5a-h illustrate a method for manufacturing the silicon-on-insulator chip of FIG. 3 according to one embodiment of the present disclosure.

Referring to FIG. 5a for purposes of continued and further example, a line drawn from the center of the silicon-on-insulator substrate 100 to the notch 14 (FIG. 1) would be pointing out of the page, as illustrated. The [010] crystal direction for the silicon layer 30 and the [110] crystal direction for the silicon substrate 10 are substantially parallel (e.g. within plus or minus 10 degrees of parallel). The silicon-on-insulator substrate 100 may be formed, for example, by a wafer bonding and wafer separation technique.

Figure 5B:
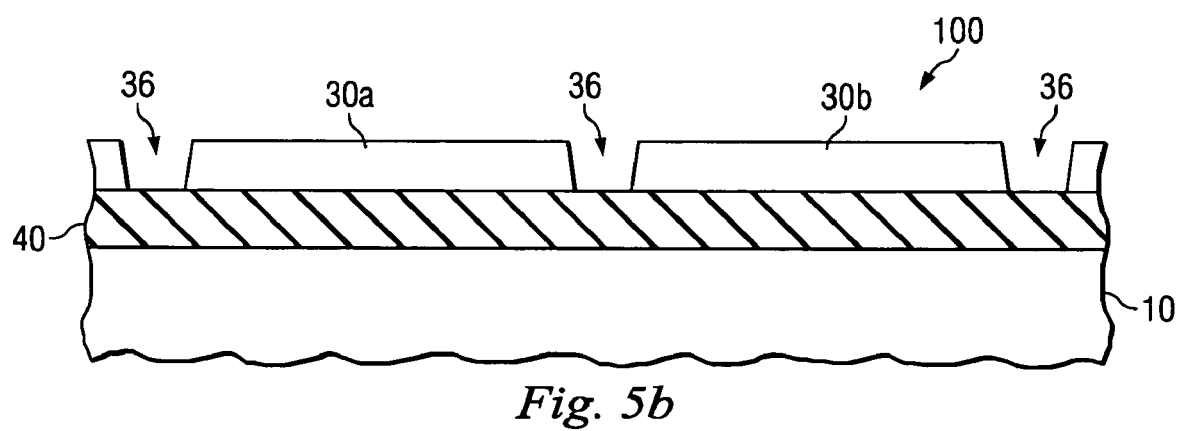
Figure 5C:
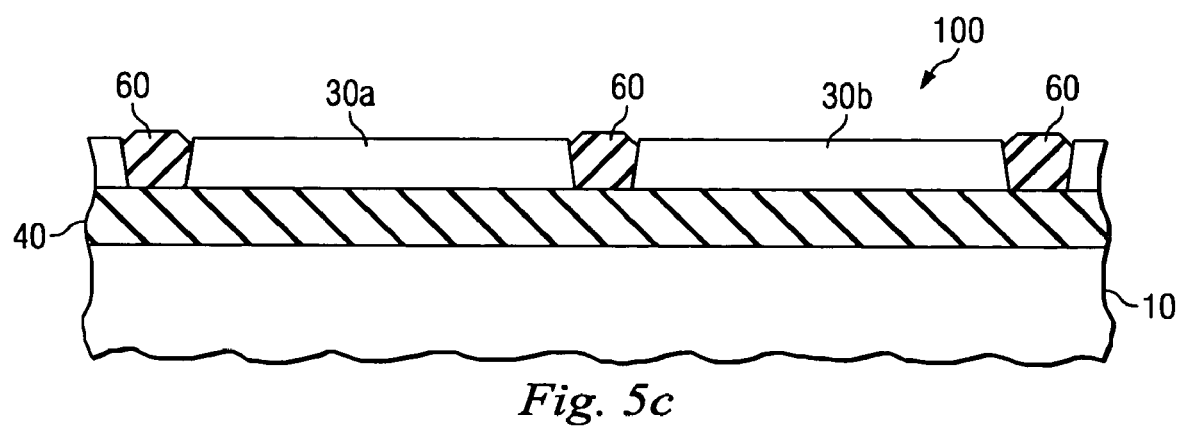

Referring now to FIG. 5b, the trenches 36 are formed in the silicon layer 30 (FIG. 5a) to define active regions 30a, 30b. This may be accomplished by forming a patterned mask to cover portions of the silicon layer 30 where active regions 30a, 30b are to be formed, followed by etching of exposed portions of the silicon layer to form the trenches 36. The etching may be a dry plasma etching process, for example. If mesa isolation is used, the trenches 36 would not be filled prior to the formation of transistors. If shallow trench isolation (STI) is used, the trenches 36 would be filled with a trench-filling material (60 of FIG. 5c), such as silicon oxide using a process such as chemical vapor deposition. The resulting structure may be planarized, and the patterned mask removed, to give a structure as shown in FIG. 5c.

Figure 5D:
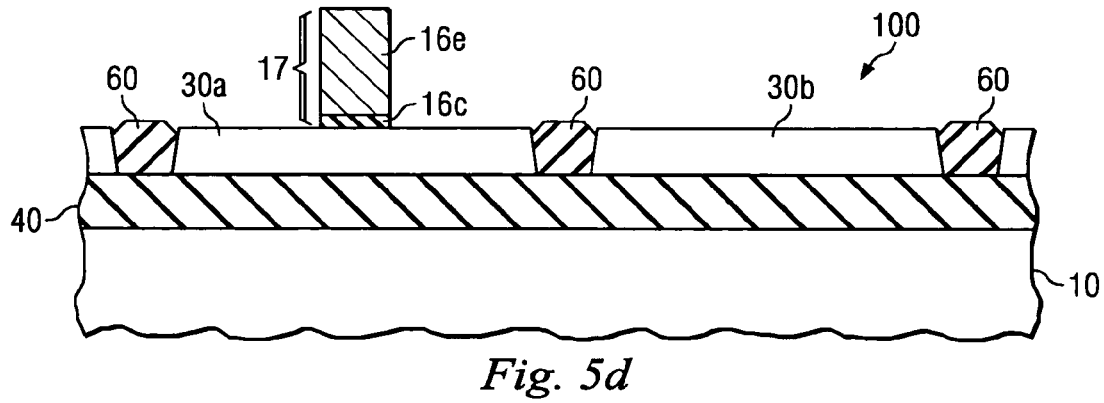

Referring now to FIG. 5d, a gate stack 17 is formed on active region 30a. The gate stack 17 comprises the gate electrode 16e overlying the gate dielectric 16c. The gate dielectric 16c may be formed on the active region 30a using any gate dielectric formation process known and used in the art (e.g. thermal oxidation, nitridation, sputter deposition, or chemical vapor deposition). The physical thickness of the dielectric 16c may be in the range of 5 to 100 angstroms. The dielectric 16c may employ a conventional gate dielectric such as silicon oxide and silicon oxynitride or a high permittivity (high-k) gate dielectric, or combinations thereof. The high-k dielectric may have a permittivity of larger than 8, selected from a group comprising of aluminum oxide $Al_2O_3$, hafnium oxide $HfO_2$, hafnium oxynitride HfON, hafnium silicon oxynitride HfSiON, hafnium silicate $HfSiO_4$, zirconium oxide $ZrO_2$, zirconium oxynitride ZrON, zirconium silicate $ZrSiO_4$, yttrium oxide $Y_2O_3$, lanthalum oxide $La_2O_3$, cerium oxide $CeO_2$, titanium oxide $TiO_2$, tantalum oxide $Ta_2O_5$, or combinations thereof. In one embodiment, the high-k dielectric is hafnium oxide. The silicon oxide equivalent thickness (EOT) of the dielectric 16c may be larger than 5 angstroms, and in the present embodiment is larger than 20 angstroms. The physical thickness of the dielectric 16c may be larger than 5 angstroms and in the present embodiment is larger than 40 angstroms.

A material for the gate electrode 16e may be deposited on the dielectric 16c. The gate electrode material 16e may comprise conventional poly-crystalline silicon, poly-crystalline silicon germanium, metals, metallic silicides, metallic nitrides, or conductive metallic oxide. In one embodiment, the electrode 16e comprises poly-crystalline silicon. Metals such as molybdenum, tungsten, titanium, tantalum, platinum, and hafnium may also be used as a portion of the electrode 16e. Metallic nitrides may include, but will not be restricted to, molybdenum nitride, tungsten nitride, titanium nitride, tantalum nitride. Metallic silicides may include, but will not be restricted to, nickel silicide, cobalt silicide, tungsten silicide, titanium silicide, tantalum silicide, platinum silicide, erbium silicide. Conductive metallic oxides may include, but will not be restricted to, ruthenium oxide and indium tin oxide.

The gate electrode material may be deposited by conventional techniques such as chemical vapor deposition. The gate electrode 16e may also be formed by the deposition of silicon and metal, followed by an anneal to form a metal silicide gate electrode material. A patterned gate may then be formed on the gate electrode material using deposition and photolithography techniques. The gate mask may employ commonly used masking materials such as, but not limited to, silicon oxide, silicon oxynitride, and silicon nitride. The gate electrode material is then etched using plasma etching processes to form the gate electrode 16e. The gate dielectric material on regions not covered by the gate electrode 16e is usually etched away.

Figure 5E:
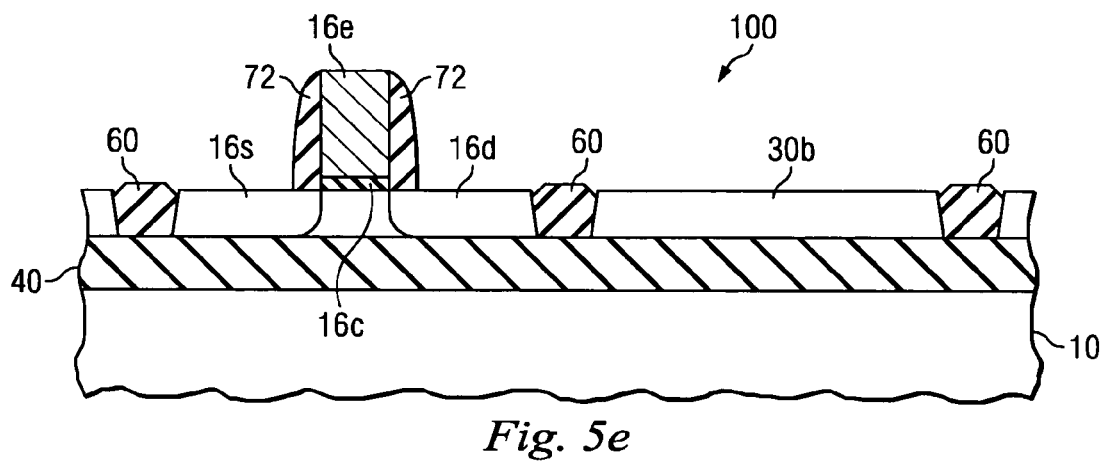

Referring now to FIG. 5e, a source and drain extension implant may be performed. A spacer 72 is formed, for example, by deposition of a spacer dielectric (e.g. silicon nitride) followed by anisotropic etching. It is understood that the spacer dielectric 72 may in fact comprise a multi-layer of different dielectrics, e.g. silicon nitride on silicon oxide. This may be followed by a second and deeper source and drain implant.

Figure 5F:
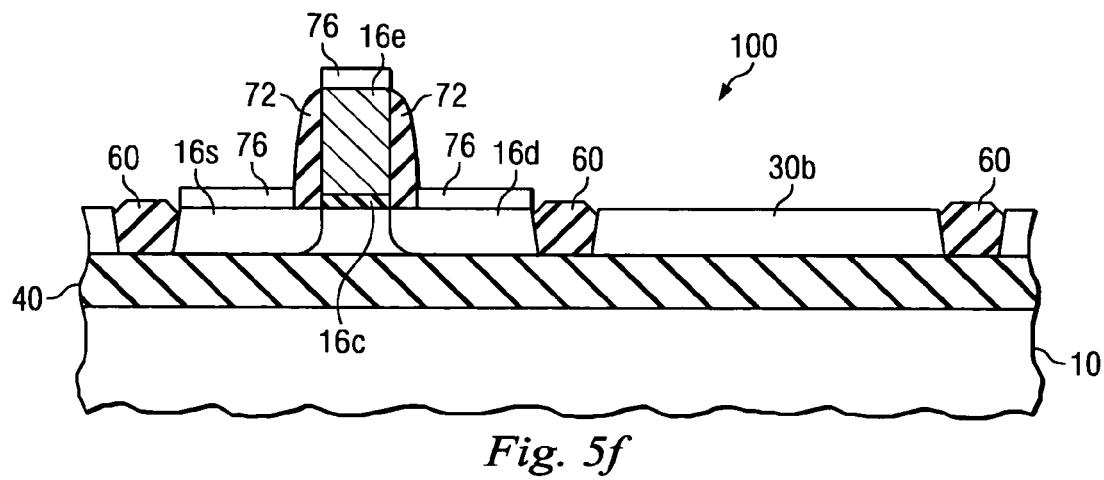

Referring now to FIG. 5f, a resistance of the source 16s, drain 16d, and gate electrode 16e in the transistor 16 may be reduced by strapping the source/drain regions with a silicide 76, e.g. using a self-aligned silicide (salicide) process, or other metal deposition process. A mask, e.g. an oxide, is may be used prior to the silicidation process to cover portions of the substrate where silicidation is not intended (e.g. an active region where the resistance is to be kept high). For example, the oxide mask may cover an active region while the silicidation process is performed to form silicides on the gate electrode 16e, and source region 16s, and drain region 16d of the transistor.

Figure 5G:
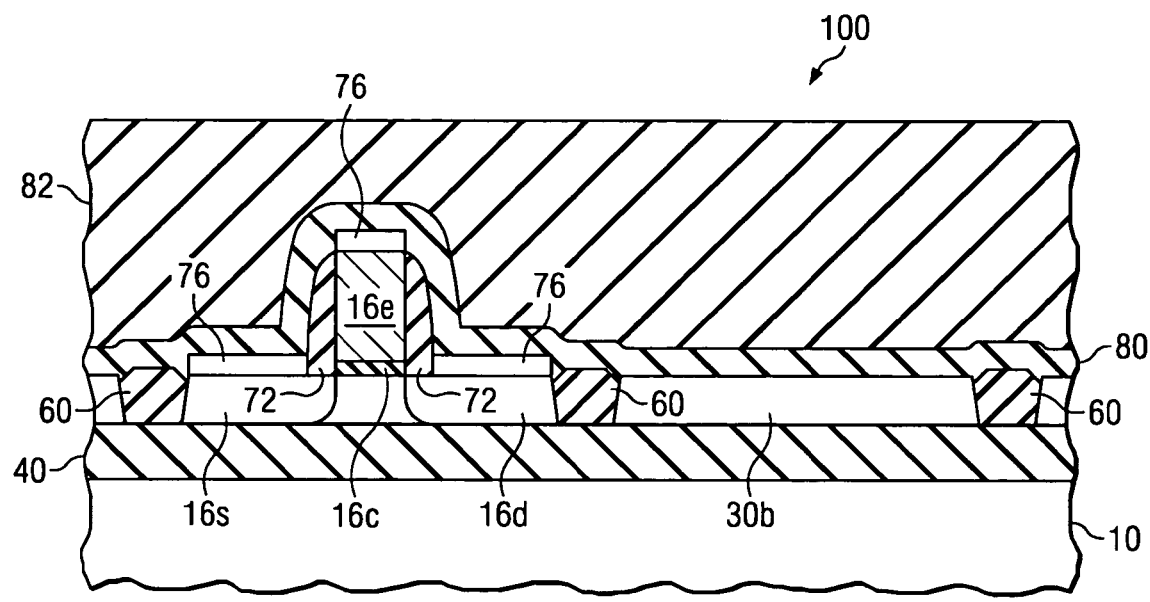

Referring now to FIG. 5g, a high stress film 80 may be deposited, followed by the deposition of a passivation layer 82. The high stress film 80 may be a silicon nitride or silicon oxynitride film deposited by plasma-enhanced chemical vapor deposition. In the present embodiment, the high stress film 80 is deposited over NMOS and PMOS transistors. The high stress film 80 may have a stress magnitude in the range of 200 MPa to 2 GPa. When the thickness of the active region (30a, 30b of FIG. 5b) is thinner, the resulting stress in the channel region of the transistor is larger. Stress in the channel region also increases when the gate (e.g. 16g of FIG. 3) length is reduced.

Figure 5H:
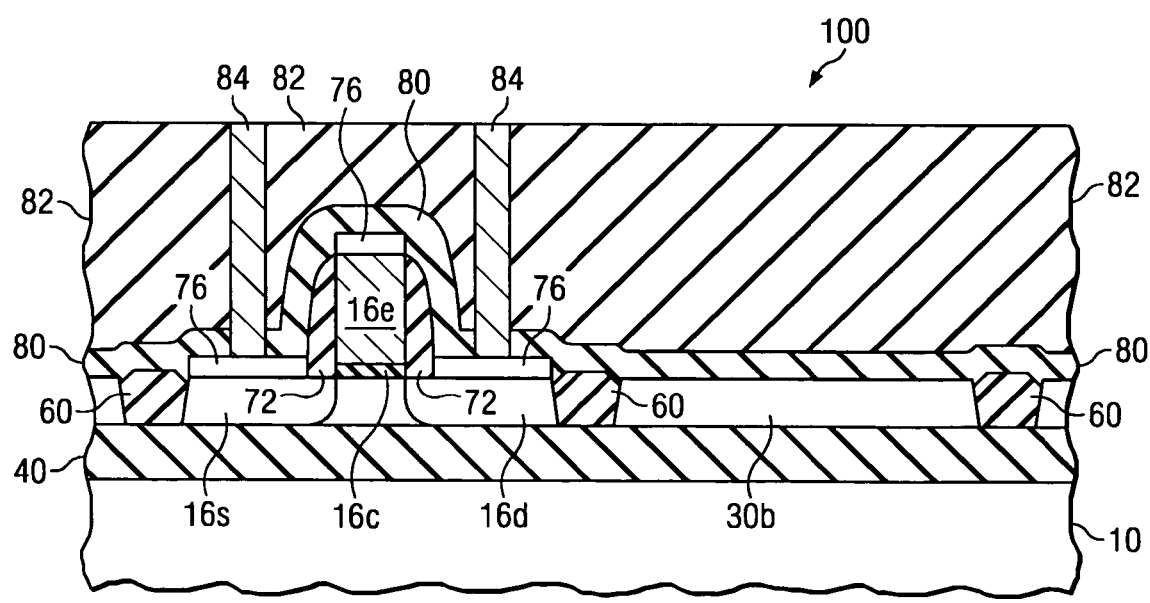

Referring now to FIG. 5h, contact holes may be etched through the passivation layer 82, stopping on the contact etch stop layer. A conductive material is then filled into the contact holes to form conductive contacts 84 to the transistor.

Although in this disclosure, particular embodiments have been described in detail, it is understood that the disclosure is not limited correspondingly in scope, but includes all changes, modifications, and equivalents coming within the spirit and terms of the claims appended hereto. Accordingly, the specification and figures are to be regarded in an illustrative rather than a restrictive sense.

What is claimed is:

1. An integrated circuit comprising:
   a semiconductor substrate including a first semiconductor layer on an insulator wherein the first semiconductor layer having <100> direction and a top surface with a (001) orientation,
   at least one field effect transistor on said substrate, said at least one field effect transistor having at least one gate electrode and a strained channel with the <100> source-to-drain direction, and wherein the strained channel includes a tensile strain substantially in the <100>direction of the first semiconductor layer;
   at least three interconnection electrical nodes for contacting said at least one field effect transistor.

2. The integrated circuit of claim 1, wherein said semiconductor substrate comprises at least one from a group consisting of silicon, germanium, gallium, and arsenic.

3. The integrated circuit of claim 1, wherein the at least one field effect transistor comprises a gate dielectric underlying said at least one gate electrode and wherein the gate dielectric has a dielectric constant greater than 8.

4. The integrated circuit of claim 1, wherein said gate electrode is a metal gate.

5. The integrated circuit of claim 1, wherein said gate electrode is polysilicon gate.

6. The integrated circuit of claim 1 wherein the semiconductor substrate includes a second semiconductor layer, and wherein the first semiconductor layer and the second semiconductor layer are separated by at least one dielectric which composes said insulator.

7. The integrated circuit of claim 6, wherein said dielectric comprises silicon, nitrogen, carbon, or combinations thereof.

8. The integrated circuit of claim 6, wherein said dielectric has a dielectric constant less than 4.5.

9. A semiconductor device, comprising:
   a silicon active region overlying an insulator layer, the silicon active region having a (001) oriented top surface and a <100> crystal direction, wherein the silicon active region has a tensile strain substantially in the <100> crystal direction; and
   a substrate underlying the insulator layer, the substrate having a <110> crystal direction;
   wherein the <100> crystal direction of the silicon active region is substantially parallel to the <110> direction of the substrate.

10. The semiconductor device of claim 9 wherein the substrate is a silicon substrate having a (001) oriented top surface.

11. The semiconductor device of claim 9 further comprising a first transistor of a first conduction type formed on the silicon active region and having a strained channel region.

12. The semiconductor device of claim 11 wherein the first conduction type is N-type.

13. The semiconductor device of claim 11 wherein the strained channel region has a tensile strain in a source-to-drain direction.

14. The semiconductor device of claim 11 further comprising a stress film formed on the first transistor wherein the stress film has a magnitude in the range of 200 MPa to 2 Gpa.

15. The semiconductor device of claim 14 wherein the high stress film comprises silicon and nitrogen.

16. The semiconductor device of claim 9 wherein the silicon active region has a thickness in the range of 20 angstroms to 500 angstroms.

17. The semiconductor device of claim 9 wherein the silicon active region has rounded corners.

18. A semiconductor device comprising:
   an insulator layer;
   a silicon active region positioned on a first side of the insulator layer, wherein the silicon active region has a first crystal direction of a <100> direction, a (001) oriented top surface, and a tensile strain in substantially the first crystal direction of the <100> direction; and
   a substrate positioned on a second side of the insulator layer, wherein the substrate has a second crystal direction that is different from the first crystal direction.

19. The semiconductor device of claim 18 wherein the second crystal direction of the substrate is a <110> direction that is parallel with the first crystal direction of the <100>direction of the silicon active region.

20. The semiconductor device of claim 18 further comprising a first transistor of a first conduction type formed on the silicon active region and having a strained channel region.

21. The semiconductor device of claim 20 wherein the strained channel region has a tensile strain in a source-to-drain direction.

22. The semiconductor device of claim 21 wherein the silicon active region has a thickness in the range of 20 angstroms to 2000 angstroms.

23. The semiconductor device of claim 21 wherein the silicon active region has faceted corners.

24. The semiconductor device of claim 18 further comprising a stress film formed on the first transistor wherein the stress film has a stress magnitude in the range from about 200 MPa to about 2 GPa.

25. A semiconductor chip comprising:
first and second active regions overlying an insulator layer, the active regions having a (001) oriented top surface and a <100> crystal direction, wherein the first and second active regions include a tensile strain in substantially the <100> crystal direction; and
a substrate underlying the insulator layer, the substrate having a <110> crystal direction;
wherein the <100> crystal direction of the first and second active regions are substantially parallel to the <110> crystal direction of the substrate.

26. The semiconductor chip of claim 25 further comprising a first N-channel transistor formed on the first active region and a first P-channel transistor formed on the second active region.

27. The semiconductor chip of claim 26 wherein the first N-channel transistor and the first P-channel transistor each have a strained channel region.

28. The semiconductor chip of claim 27 wherein the substrate is a silicon substrate having a (001) oriented top surface.

29. The semiconductor chip of claim 26 wherein the first N-channel transistor and the first P-channel transistor are isolated using mesa isolation or shallow trench isolation.

30. The semiconductor chip of claim 25 wherein the first active region has a thickness in the range of 20 angstroms to 300 angstroms.

31. A silicon-on-insulator semiconductor device comprising:
a silicon active region overlying an insulator layer, the silicon active region having a (001) oriented top surface and a <100> crystal direction;
a substrate underlying the insulator layer; and
a first transistor formed on a portion of the silicon active region, the first transistor having a strained channel region, wherein the strained channel region includes a tensile strain substantially in the <100> crystal direction.

32. The silicon-on-insulator semiconductor device of claim 31 further comprising a stress film formed on at least the first transistor, wherein the stress film has a magnitude ranging from about 200 MPa to about 2 GPa.

33. The silicon-on-insulator semiconductor device of claim 31 wherein the first transistor comprises a gate dielectric selected from a group consisting of silicon oxide, silicon oxynitride, silicon nitride, or combinations thereof.

34. The silicon-on-insulator semiconductor device of claim 33 wherein the first transistor comprises a gate dielectric selected from a group consisting of aluminum oxide, hafnium oxide, hafnium oxynitride, hafnium silicate, zirconium oxide, zirconium oxynitride, zirconium silicate, yttrium oxide, lanthanum oxide, cerium oxide, titanium oxide, tantalum oxide, or combinations thereof.

35. The silicon-on-insulator semiconductor device of claim 31 wherein the first transistor comprises a gate electrode selected from a group consisting of poly-crystalline silicon, poly-crystalline silicon-germanium, a metal, a metallic nitride, a metallic silicide, a metallic oxide, or combinations thereof.

* * * * *